United States Patent [19]
Byrne

[11] Patent Number: 5,982,260
[45] Date of Patent: Nov. 9, 1999

[54] MRI MAGNETS

[75] Inventor: Alex Francis Byrne, Reading, United Kingdom

[73] Assignee: Oxford Magnet Technology Limited, Oxon, United Kingdom

[21] Appl. No.: 08/784,337

[22] Filed: Jan. 16, 1997

[30]     Foreign Application Priority Data

Jan. 19, 1996 [GB]  United Kingdom ............... 9601113

[51] Int. Cl.⁶ .................................................. H01F 6/06
[52] U.S. Cl. ..................... 335/216; 335/296; 335/297; 335/301; 324/319
[58] Field of Search ........................... 335/216, 296–306; 324/318, 319, 320; 600/410–423

[56]          References Cited

U.S. PATENT DOCUMENTS

| | | | |
|---|---|---|---|
| 5,136,273 | 8/1992 | Ohta ........................................ | 335/301 |
| 5,343,182 | 8/1994 | Ohta ........................................ | 335/299 |
| 5,361,054 | 11/1994 | Knüttel ................................... | 335/216 |
| 5,381,122 | 1/1995 | Laskaris et al. ....................... | 335/216 |
| 5,412,363 | 5/1995 | Breneman et al. .................... | 335/216 |

FOREIGN PATENT DOCUMENTS

| | | |
|---|---|---|
| 4010032 | 10/1991 | Germany . |
| WO88/04057 | 6/1988 | WIPO . |
| 93/00798 | 8/1993 | WIPO . |

OTHER PUBLICATIONS

Laskaris et al. "A Cryogen–Free Open Superconducting Magnet for Interventional MRI Applications", IEEE Transations in Applied Superconductivity, vol. 5, No.2, pp. 163–168, Jun., 1995.

Primary Examiner—Lincoln Donovan
Assistant Examiner—Raymond Barrera
Attorney, Agent, or Firm—Evenson, McKeown, Edwards & Lenanhan, P.L.L.C.

[57]          ABSTRACT

An open electromagnet for use in MRI apparatus includes a pair of field coils which respectively comprise juxtaposed poles between which an imaging volume of substantially homogeneous magnetic field is defined. A support structure, which serves rigidly to support the field coils in spaced apart relationship, includes two steel plates between which the field coils are positioned. The relative position of the field coils and the plates is selected such that forces of magnetic attraction between the field coils are at least partly counterbalanced by forces of attraction between the plates and the field coils. In this manner, the force on the field coils and their associated support structure due to the forces of attraction between the poles is significantly reduced or nullified.

10 Claims, 2 Drawing Sheets

MRI MAGNETS

BACKGROUND OF THE INVENTION

This invention relates to electromagnets for use in magnetic resonance imaging (MRI) systems and in particular to magnets which are open, i.e., magnets in which an imaging volume wherein that portion of a patient being imaged is positioned, is not surrounded by the magnet.

A special requirement for MRI is a strong uniform magnetic field, typically 0.2 to 2 Tesla, with a field homogeneity of a few parts per million in the imaging volume, typically a sphere of 30 cm to 50 cm in diameter. Most commonly such a field is produced by an electromagnet having a solenoid construction but this necessitates a patient being surrounded by the magnet and enclosed within a tube, which can cause a feeling of claustrophobia. However by using open magnets, to which this invention particularly relates, this problem is overcome.

Open electromagnets for use in MRI systems are well known. One known form of electromagnet comprises a pair of juxtaposed magnetic poles of opposite polarity between which the imaging volume is defined, which poles are linked and supported by a yoke which provides a magnetic flux return path and which principally comprises a generally C-shaped iron frame. Because large amounts of iron are required, these known C-shaped magnets are very heavy, especially for high field magnets which require many tonnes of iron to define the flux return path.

Another known form an open electromagnet, often described as a 'split pair', comprises a pair of juxtaposed sets of coils, which are generally of a solenoid construction and may include a bore tube around the axis. The sets of coils are held apart by a support structure so that access may be gained to the imaging volume between them along any of the principal axes of the system. Such a system is described in U.S. Pat. Ser. No. 5,381,122 and in a paper by Laskaris et al, entitled 'A Cryogen-Free Open Superconducting Magnet for Interventional MRI Applications' published in IEEE Transactions in Applied Superconductivity, Volume 5, Number 2, June 1995.

The magnetic force between the juxtaposed magnetic poles of known open magnets is very large, and accordingly this imposes large forces on a structure used to support the poles. Moreover, in superconducting electromagnets, wherein field windings which define the poles are contained in a cryostat, mechanical design problems arise due to the requirement for supporting, within the cryostat, windings which are subjected to this very large magnetic force. In known 'split-pair' systems, this problem is overcome by arranging that the supporting structure which resists this magnetic force is connected directly between the windings and is therefore maintained at the same low temperature as the windings. However this requires large structural components which extend across the gap between the juxtaposed poles, severely restricting the openness of the system and requiring a very complex and expensive arrangement for the cryostat.

An alternative approach is to transmit forces acting on the cryostatically contained juxtaposed windings mechanically to 'warm' parts of the clryostat structure, and to provide a support frame which serves to hold the two cryostats apart. Conventionally, 'cold' components within a cryostat are supported by means of rods or bands made from material with a low thermal conductivity and high strength, such as glass fibre reinforced plastics material. However the magnetic forces between the poles are many times greater than forces due to their weight, with the result that supporting bands or rods must have a much larger cross-section to transmit these forces and consequently they allow a much larger flow of heat into the 'cold' parts of the system. In a system cooled by liquid helium this results in a high rate of evaporation of the liquid, and in a system cooled by a cryogenic refrigerator this results in excessive power consumption.

It is known that the use of large amounts of iron in close proximity to the coils will substantially modify the forces acting on the coils. For example, in Danby et al, PCT WO88/04057, the forces on the coils in an iron shielded magnet are reduced by more than an order of magnitude by suitable positioning of the coils relative to the iron. However, this does not address the weight issue, which in the case described results in a system weighing in excess of 100 tonnes in order to limit the stray field to a reasonable value.

SUMMARY OF THE INVENTION

It is therefore an object of the present invention to provide an open electromagnet with low weight and reduced stray field, wherein the requirement for substantial support members within the cryostat is obviated.

According to the present invention, an open electromagnet includes a pair of field coils which respectively comprise juxtaposed poles of the electromagnet between which an imaging volume of substantially homogeneous magnetic field is defined, a support structure which serves rigidly to support the field coils in spaced apart relationship, wherein the support structure comprises two plates of magnetic material, between which the field coils are positioned, the relative position of the field coils and the plates being such, having regard to the magnetic field strength of the electromagnet, that forces of magnetic attraction between the field coils are at least partly counter-balanced by forces of attraction between the plates and the field coils, whereby forces of attraction between the poles are transmitted to the support structure magnetically via said plates, and a pair of shielding coils, the coils of the pair being respectively positioned between the plate and the field coil of opposing poles, which shielding coils are energised in a sense opposite to the field coils.

The counter-balancing may be magnetically adjusted so as to counter-balance magnetic forces only. However, it will be appreciated that in order to compensate also for forces due to the weight of field coil components it is possible to arrange that the forces of attraction between the plate and the field coils are greater in an upper of the two poles than corresponding forces in a lower of the two poles. This difference between upper and lower poles is necessary to achieve a counter-balance which takes account of forces due to weight, because in the upper pole the weight acts in the same direction as forces of attraction between the poles, whereas in the lower pole it acts in the opposite direction.

Thus it is arranged that the net forces acting between the poles although substantially unaltered, are confined to components which are at room temperature whereby the need for substantial structural support members within the cryostat is obviated.

The electromagnet may include a pair of shielding coils, the coils of the pair being respectively positioned between the plate and the field coil of opposing poles, which shielding coils are energised in a sense opposite to the field coils.

There may be provided at least one pair of shimming coils positioned respectively between the field coils on each side of the imaging volume.

The support structure may comprise a non-magnetic frame to which the plates are attached. Alternatively, the plates may form a part of a magnetic yoke which at least partly defines the support structure.

The electromagnet may be a superconducting electromagnet, wherein the coils are cryostatically contained in liquid helium or directly refrigerated.

Other objects, advantages and novel features of the present invention will become apparent from the following detailed description of the invention when considered in conjunction with the accompanying drawings.

DETAILED DESCRIPTION OF THE DRAWING

Figure 1:
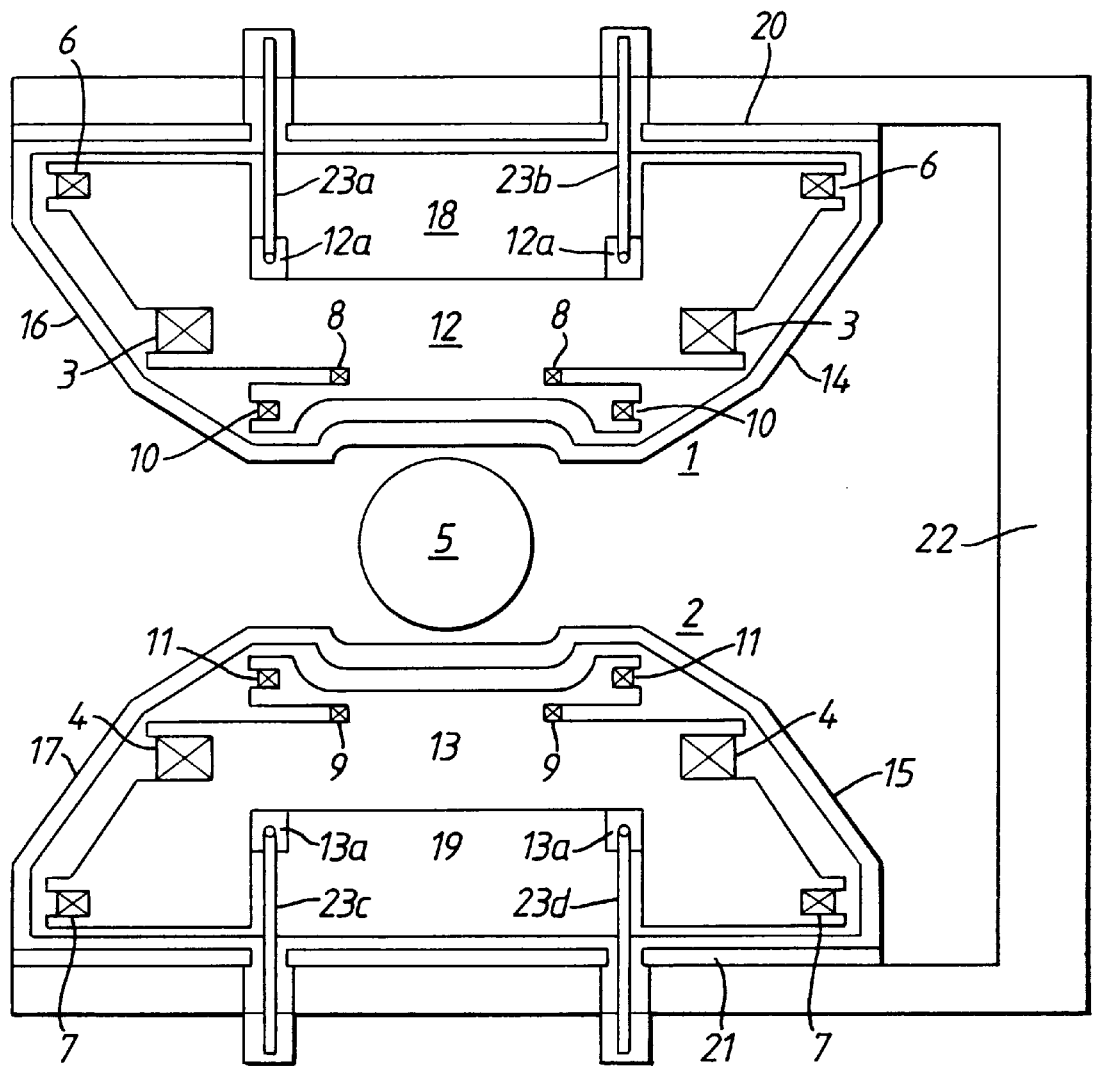
FIG. 1 is a somewhat schematic side view of a 'C' electromagnet for an MRI system, and, FIG. 2 is a somewhat schematic side view of an alternative 'C' magnet for use in an MRI system.

Referring now to FIG. 1, a 'C' electromagnet comprises a pair of poles 1 and 2 having a pair of field coils 3 and 4 respectively, which provide a substantially a homogeneous magnetic field in an imaging volume 5. The field coils 3 and 4 are positioned between a pair of shielding coils 6 and 7, which are energised in a sense opposite to the sense in which the field coils 3 and 4 are energised. In order to homogenise the magnetic field in the imaging volume 5 as required for good imaging, two pairs of shimming coils 8, 9 and 10, 11 are provided, which are positioned between the imaging volume 5 and the field coils 3 and 4.

The coils are supported on formers 12 and 13 to withstand inter-coil forces and the formers 12 and 13 are secured via strong points 12a and 13a respectively. The coils 3, 6, 8, 10 and 4, 7, 9, 11 are mounted on the formers 12 and 13 respectively which are contained in cryostat vessels 14 and 15 respectively. The formers 12 and 13 are connected to the low temperature stage of a 2-stage cryogenic refrigerator (not shown) to cool them to a low temperature so that the coils 3, 4, 6, 7, 8, 9, 10 and 11 become superconducting. The first stage of the cryogenic refrigerator is connected to radiation shields 16 and 17 to cool them to a temperature of around 60K to minimise the amount of heat radiated onto the coils. Spaces 18 and 19 within the cryostat vessels 14 and 15 respectively are evacuated.

There are very high magnetic forces between the coils 3, 6, 8 and 10 and the coils 4, 7, 9 and 11 which are supported by the formers 12 and 13. The resultants of these forces, which attract the former 12 towards the former 13 are counterbalanced by forces which attract the coils 3, 6, 8, 10 and 4, 7, 9, 11, respectively towards steel plates 20 and 21 which form part of the cryostat vessels 14, 15. These steel plates 20, 21 and hence the cryostat vessels 14, 15 are supported by a structure 22. The extent to which the force between the set of coils 3, 6, 8, 10 and the steel plate 20 counterbalances the force attracting the coils towards the opposite pole can be adjusted by varying the separation between these coils and the plate 20. As the plate is brought in closer proximity to the coils, the force of attraction between the set of coils 3, 6, 8, 10 and the plate 20 increase while the force attracting the set of coils towards the opposite pole remains substantially constant. There is a point, which can be calculated using commercially available finite element computer programs, at which the forces are balanced so that there is no net magnetic force acting on the set of coils 3, 6, 8, 10 and their former 12.

This equilibrium point is achieved with a separation which depends on the size of the steel plate; i.e. the greater the thickness the greater the separation.

Although the resultant magnetic forces acting on the formers 12 and 13 are much reduced, they are not zero, since it is also necessary to support the weight. However, as hereinbefore explained it is also possible, if required, to compensate for forces due to weight. Conventional support rods are provided for support purposes, of which only some (23a, 23b, 23c, 23d) are shown for clarity. The size of these rods, and hence the amount of heat they conduct, to the cold parts of the system, is substantially the same as those used in conventional superconducting magnets since (if weight is not compensated for) they need to support only the weight of the system, rather than the many tonnes of magnetic force associated with known split-pair and open magnets. It will be apparent that if weight is compensated for even smaller size rods may be used.

The foregoing description refers to a system in which the coils are cooled directly from a cryogenic refrigerator. However, an alternative arrangement would be to contain the coils and former within a container filled with liquid helium within the cryostat vessels.

Figure 2:
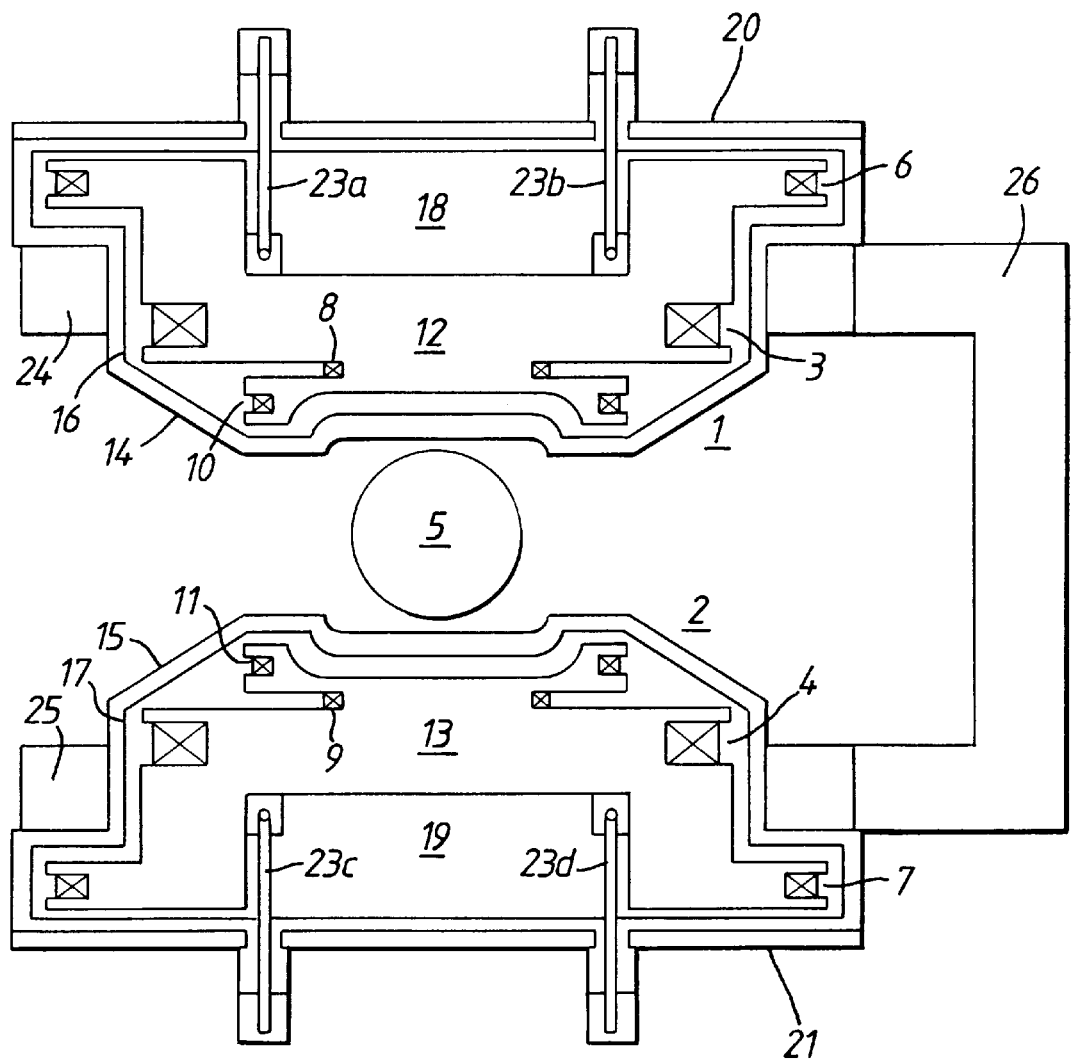

Referring now to FIG. 2, wherein parts corresponding to FIG. 1 bear, as appropriate, the same designations. A magnet supporting structure comprises a steel magnetic flux return yoke 26, which is coupled to steel rings 24 and 25, which are positioned between the field coil 3 and the shielding coil 6 in one pole and the field coil 4 and the shielding coil 7 in the other pole of the electromagnet. As shown in FIG. 2, the rings 24 and 25 are arranged to form part of cryostats 14 and 15.

In FIG. 1 and in FIG. 2, it will be appreciated that the effect of the shielding coils 6 and 7 is to constrain the magnetic return flux. This flux constraint is aided substantially in the arrangement of FIG. 2 by the provision of the steel magnetic flux return yoke 26.

In both embodiments of the invention, as hereinbefore described, forces on a structure which supports the coils within the poles of a 'C' electromagnet are substantially nullified or significantly reduced by suitable positioning of field coils of the magnet with respect to steel plates between which the field coils are coaxially positioned. It will be readily appreciated that the precise position of the field coils will be chosen having regard to the strength of the magnet and the pole dimensions, so that the required degree of force balancing is achieved. It will also be appreciated that although a 'C' configuration magnet has been hereinbefore described the invention may equally well be applied to other open magnet configurations such as 'H' or 'temple' configurations for example.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

I claim:

1. An open superconducting electromagnet arrangement comprising:
    a pair of field coils, each field coil being contained in one of a pair of cryostat vessels, the field coils respectively forming first and second poles of a superconducting electromagnet and being separated from each other by an open space;

an imaging volume defined in said open space, wherein a substantially homogeneous magnetic field is formed;

a pair of first support structures which rigidly support each of the field coils within one of said cryostat vessels, and a second support structure which serves to rigidly support said pair of cryostat vessels in spaced apart relationship separated by said open space, each of said first support structures comprising a plate of magnetic material between which the field coils are positioned, a relative position of the field coils and the plates being such that forces of magnetic attraction between the field coils attributable to magnetic field strength of the electromagnet are substantially counter-balanced by forces of magnetic attraction between the plates and the field coils, forces of magnetic attraction between the poles being transmitted to the second support structure magnetically via said plates thereby reducing a requirement for substantial support members within each of said pair of first support structures; and a pair of shielding coils positioned respectively between the plate and the field coil of each of said first and second poles, which shielding coils are energized in a sense opposite to the field coils.

2. An open superconducting arrangement as claimed in claim 1, wherein there is provided at least one pair of shimming coils, positioned respectively between the field coils on each side of the imaging volume.

3. An open superconducting arrangement as claimed in claim 1, wherein the second support structure comprises a non-magnetic frame to which the plates are attached.

4. An open superconducting arrangement as claimed in claim 1, wherein the plates form a part of a magnetic yoke which at least partly defines the second support structure.

5. An open superconducting arrangement as claimed in claim 1, wherein the field coils are maintained at temperatures close to absolute zero utilising a refrigerator.

6. An open superconducting arrangement as claimed in claim 1, wherein the field coils are contained in liquid helium.

7. An open superconducting arrangement as claimed in claim 1, which is of 'C' configuration.

8. An MRI system comprising an open superconducting arrangement as claimed in claim 1.

9. The arrangement according to claim 1, wherein said field coils are axially aligned and said open space is open at an axial periphery thereof.

10. An open superconducting electromagnet as claimed in claim 1, wherein the plates are further arranged such that the forces of magnetic attraction between the plates and said pair of field coils are greater in an upper pole of the first and second poles than corresponding forces in a lower pole of the first and second poles such that forces due to weight of said pair of field coils is substantially counter-balanced.

* * * * *